(12) United States Patent
Lo et al.

(10) Patent No.: US 7,312,127 B2
(45) Date of Patent: Dec. 25, 2007

(54) INCORPORATING DOPANTS TO ENHANCE THE DIELECTRIC PROPERTIES OF METAL SILICATES

(75) Inventors: Wai Lo, Lake Oswego, OR (US); Verne Hornback, Camas, WA (US); Wilbur G. Catabay, Saratoga, CA (US); Wei-Jen Hsia, Saratoga, CA (US); Sey-Shing Sun, Portland, OR (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/389,643

(22) Filed: Mar. 23, 2006

(65) Prior Publication Data
US 2006/0166496 A1    Jul. 27, 2006

Related U.S. Application Data

(62) Division of application No. 10/738,761, filed on Dec. 16, 2003, now Pat. No. 7,064,062.

(51) Int. Cl.
*H01L 21/4763* (2006.01)
*B05D 3/02* (2006.01)

(52) U.S. Cl. ............. 438/285; 438/287; 438/648; 438/650; 438/785; 257/410; 257/411; 257/E21.274; 257/E21.279; 257/E21.247; 427/376

(58) Field of Classification Search .......... 438/285, 438/287, 785, 216, 261; 427/376, 410, 411; 257/E21.274, E21.279, E21.247
See application file for complete search history.

(56) References Cited

U.S. PATENT DOCUMENTS

| | | | | |
|---|---|---|---|---|
| 6,800,519 | B2 * | 10/2004 | Muraoka et al. | 438/216 |
| 2003/0059540 | A1 * | 3/2003 | Berni et al. | 427/376.1 |
| 2004/0029343 | A1 * | 2/2004 | Seidl et al. | 438/243 |

FOREIGN PATENT DOCUMENTS

| | | | | |
|---|---|---|---|---|
| EP | 0 325 345 A1 * | 9/1885 | | 254/202 |
| EP | 325345 A1 | 7/1989 | | |

\* cited by examiner

*Primary Examiner*—Michael Lebentritt
*Assistant Examiner*—Mohsen Ahmadi
(74) *Attorney, Agent, or Firm*—Beyer Weaver LLP

(57) ABSTRACT

The present invention provides a method of forming a high-k dielectric layer on a semiconductor wafer. A metal silicate dielectric layer is initially deposited on the wafer. A dopant having dissociable oxygen is introduced into the metal silicate on the wafer. According to one embodiment the metal silicate comprises a group IV metal and the dopant is an oxide of one of an alkaline metal and an alkaline earth metal. According to another embodiment the metal silicate comprises a group III metal.

9 Claims, 4 Drawing Sheets

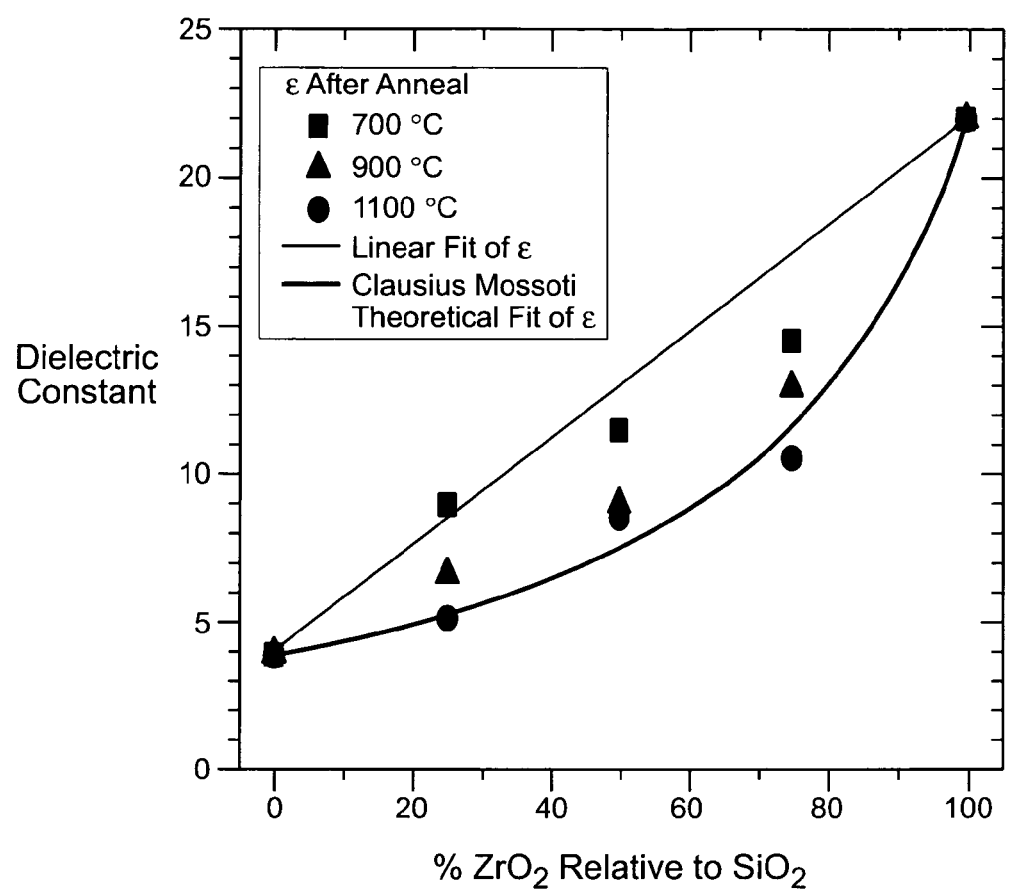
FIG._1

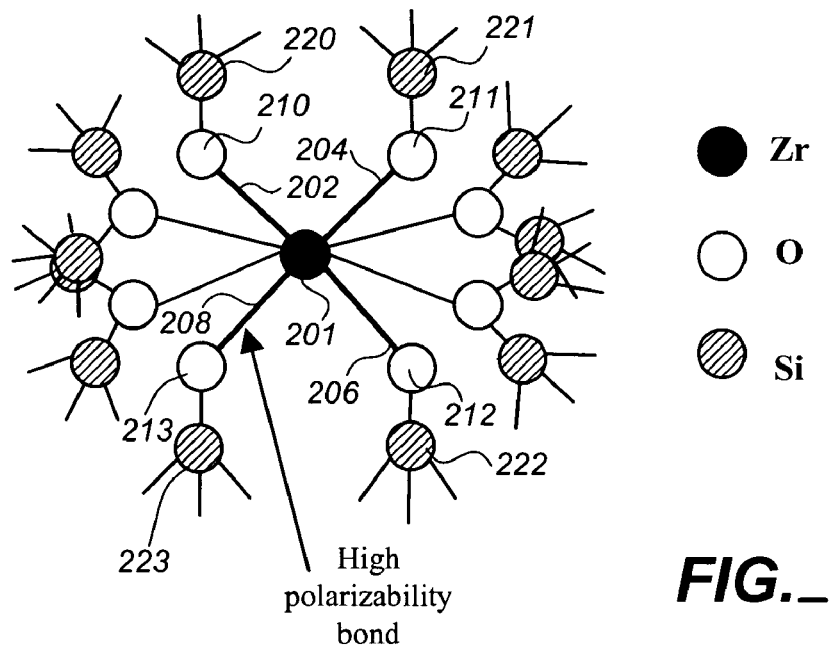
FIG._ 2A
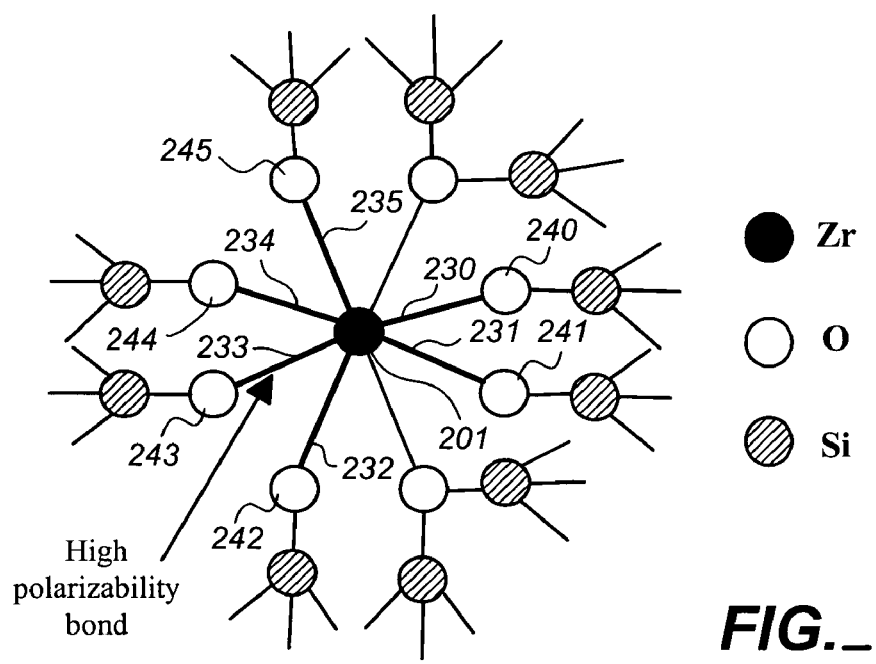
FIG._ 2B

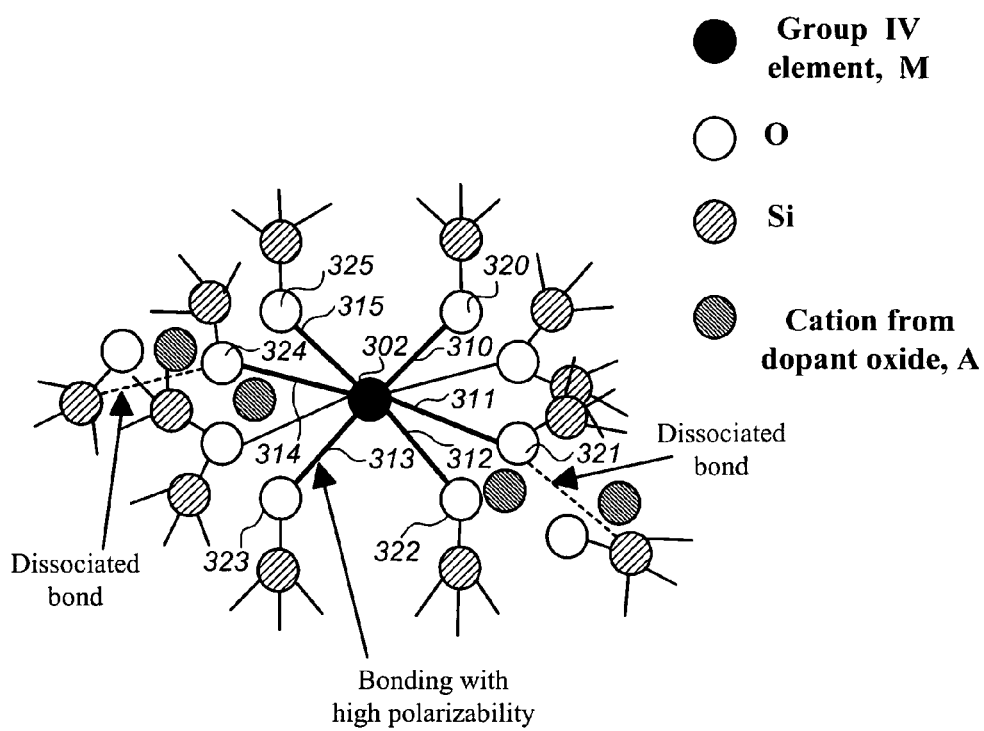
FIG._3

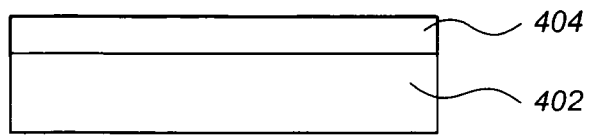
FIG._ 4A
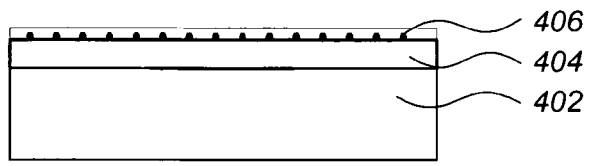
FIG._ 4B
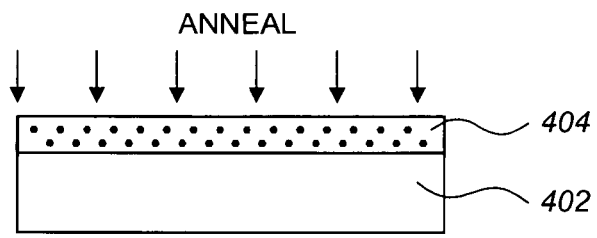
FIG._ 4C
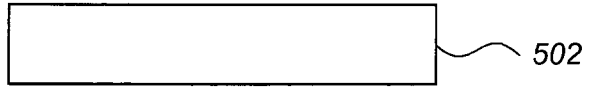
FIG._ 5A
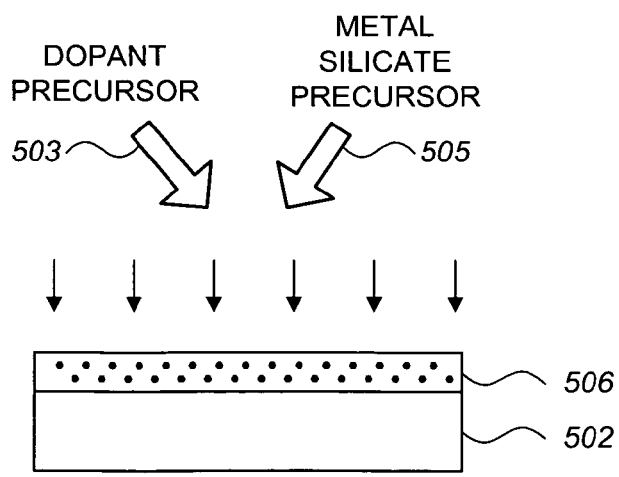
FIG._ 5B

INCORPORATING DOPANTS TO ENHANCE THE DIELECTRIC PROPERTIES OF METAL SILICATES

RELATED APPLICATIONS

This application is a divisional application of prior U.S. patent application Ser. No. 10/738,761 (03-0737/LS11P229), entitled "Incorporating Dopants to Enhance the Dielectric Properties of Metal Silicates", filed on Dec. 16, 2003 now U.S. Pat. No. 7,064,062, by inventors Wai Lo, Verne Hornback, Wilbur G. Catabay, Wei-Jen Hsia and Sey-Shing Sun, which is incorporated herein by reference and from which priority under 35 U.S.C. § 120 is claimed.

BACKGROUND OF THE INVENTION

1. Field of the Invention

The present invention relates to techniques for forming semiconductor device dielectrics. More particularly, the present invention relates to the formation of dielectrics having high dielectric constant values.

2. Description of the Related Art

Designers and semiconductor device manufacturers constantly strive to develop smaller devices from wafers, recognizing that circuits with smaller features generally produce greater speeds. Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. As the scaling of the Metal Oxide Semiconductor (MOS) transistor proceeds toward deep sub-micron dimensions, the selection of materials used in the layering steps is evolving.

That is, as semiconductor features shrink in size new materials must sometimes be used to ensure that the scaled devices maintain the proper device characteristics after miniaturization. For MOS devices, $SiO_2$ has long been used to isolate the transistor gate from the silicon channel. However, as device dimensions shrink below 100-150 nm, $SiO_2$ becomes unreliable for use as an insulator. At these sizes, the corresponding $SiO_2$ electrical characteristics for the scaled device require a physically thin $SiO_2$ gate dielectric layer. Such a thin $SiO_2$ gate dielectric layer may result in excessive current leakage, i.e., from tunneling. Many other factors determine the leakage current but the primary mechanism involved is direct tunneling in the ultra-thin thickness regime and is a function of the thickness of the dielectric layer.

One class of proposed substitute dielectric materials includes high-k (high-dielectric constant) materials. These materials typically exhibit k's (i.e., relative permitivities or dielectric constants) greater than 5.0 in comparison to the 3.9 k values normally reported for $SiO_2$. The capacitance of a MOS transistor is proportional to the dielectric constant k of the materials and inversely proportional to the distance d between the two electrodes (i.e. in a MOS device, the gate and the channel). Thus, materials with a high dielectric constant k, permit them to exhibit similar electrical characteristics to the $SiO_2$ gate dielectric when deposited in thicker layers.

The use of high-k dielectrics can benefit electronic devices in a variety of ways. Examples of potential high-k applications include the typical dual-gated or triple-gated CMOS transistors on application specific integrated circuits (ASIC) and system-on-chip (SoC) memory devices such as SRAM on system-on-chip electronic components, and designs requiring the shrinkage of large capacitors in analog IC's. That is, the applications of high-k dielectrics may be targeted to CMOS devices to reduce gate leakage, memory devices for increased packing density, and capacitors in analog devices requiring the shrinkage of their physical dimensions.

High-k dielectrics increase the capacitance of a capacitor and facilitate miniaturization. The capacitance of a capacitor is proportional to k and the surface area but inversely proportional to the separation distance between the electrodes. Thus, the capacitance can be maintained even when areas are smaller, if higher k materials are used. Moreover, the higher the k value of the material used to construct the capacitor, the more densely the capacitors can be packed on an integrated circuit chip.

Devices mentioned in each of the categories described above are facing serious difficulties related to the dielectric components of their structures. For example, in CMOS devices, the gate leakage currents in the existing devices are too high. The leakage currents, however, will only be higher in the future generations of devices since the gate dielectrics ($SiO_2$ based) will be even thinner which will result in more charge tunneling. This implies that further shrinkage of the existing CMOS transistors will require thicker dielectric layers while maintaining the same gate capacitance and thus the use of high-k materials for the gate dielectric to avoid rendering the devices unusable.

The needs for high-k materials in memory devices are also significant. Recent SoC products demand a large quantity of memory devices, which inevitably use dielectrics as part of their structures. There is a tendency to reduce the size of these devices so that as many of these devices as possible can be accommodated onto each IC chip. This, however, results in the reduction of the thickness of the dielectrics (usually $SiO_2$ based) so that charge leakage through the dielectrics will become detrimental in the devices of future technology generations.

Further miniaturization of analog IC chips also suggests increased usage of high-k materials. Analog circuits frequently require capacitors with capacitance up to several tens of nF. Capacitors having these electrical characteristics will occupy substantial portions of the IC chips, and hence prevent the shrinking of these IC chips, as well as increase their cost if conventional dielectrics are used.

Current approaches to solving these problems focus on high-k dielectrics. For CMOS devices, replacing the $SiO_2$ based gate dielectrics with high-k dielectrics, it is possible to increase the thickness of the dielectrics without changing the gate capacitance. This will suppress current tunneling, and hence reduce gate leakage currents. A high-k dielectric that can satisfy all the technical requirements for this application, however, has yet to be developed.

In memory devices, it is possible to replace $SiO_2$ with high-k dielectrics so that a thicker dielectric layers to provide the same capacitance and lower leakage currents. However, there is no high-k dielectric that can improve the performance of the memory devices while satisfying the requirements of other devices on the same integrated circuit chip.

Current approaches to the size constraints imposed by capacitors for analog IC chips involve either avoidance of the usage of large capacitors on IC chips or to bond off-chip capacitors onto printed circuit boards. The first approach frequently increases the design effort and cycle time of such chips, while the latter approach unacceptably increases manufacturing costs.

As can be seen from the above, the described problems of these devices can be solved by replacing SiO$_2$ with suitable high-k dielectrics. The major problem, however, is the absence of a high-k dielectric that can be used for all these devices, which frequently co-exist on the same IC chip. That is, no conventional high-k material resolves the varying demands for CMOS gates, memory cells, and capacitors in a satisfactory manner. Accordingly, what is needed is an improved high-k material and process for forming such material that will meet the demands of the various devices.

SUMMARY OF THE INVENTION

To achieve the foregoing, the present invention provides a method of forming a high-k dielectric layer on a semiconductor wafer. The new high-k dielectrics formed by these techniques are based on metal silicates with enhanced electrical properties provided through the use of weakly interacting dopants. The high-k dielectrics described herein can thus be used for a variety of devices such as CMOS devices, memory devices, and analog integrated circuit capacitors on the same chip without compromising performance.

According to one embodiment, the present invention provides a method of forming the high-k dielectric layers described on a semiconductor wafer. A metal silicate dielectric layer is deposited on the wafer. A dopant having dissociable oxygen is introduced into the metal silicate on the wafer before, during or after the deposition of the metal silicates. According to one embodiment the metal silicate comprises a group IV metal and the dopant is an oxide of one of an alkaline metal and an alkaline earth metal. According to another embodiment, the metal silicate comprises a group IVB metal and the dopant is an oxide of one of an alkaline metal and an alkaline earth metal.

These and other features and advantages of the present invention are described below with reference to the drawings.

BRIEF DESCRIPTION OF THE DRAWINGS

FIG. 1 is a graphical plot illustrating the changes in dielectric constant of metal silicates by associated with changes in the metal concentration.

FIGS. 2A-2B are diagrams illustrating changes in bonding for metal silicates associated with changes in the metal concentration.

FIG. 3 is a diagram illustrating the increase in high polarizability metal-oxygen bonding from oxide-based dopants in accordance with one embodiment of the present invention.

FIGS. 4A-4C are diagrams illustrating stages in the formation of a doped high-k dielectric layer in accordance with one embodiment of the present invention.

FIGS. 5A-5B are diagrams illustrating stages in the formation of a doped high-k dielectric layer in accordance with another embodiment of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention describes a design and process for producing a new class of dielectrics based on metal silicates with enhanced electrical properties provided through the use of weakly interacting dopants. The high-k dielectrics described herein can thus be used for a variety of devices such as CMOS devices, memory devices, and analog integrated circuit capacitors on the same chip without compromising performance. The present invention provides a method of forming the high-k dielectric layers described on a semiconductor wafer. A metal silicate dielectric layer is deposited on the wafer. A dopant having dissociable oxygen is introduced into the metal silicate on the wafer before, during or after the deposition of the metal silicate films. According to one embodiment the metal silicate comprises a group IV metal and the dopant is an oxide of one of an alkaline metal and an alkaline earth metal.

The high-k dielectrics formed by these methods meet the critical requirements for the variety of devices without compromising performance. These critical requirements for high-k layers can be summarized as including chemical stability, appropriate interfacial density of states with substrates, relatively high permittivity (k value), sufficiently high conduction band offset to avoid tunneling, high channel mobility, and process feasibility.

The chemical stability requirements generally relate to the stability of the high-k material with respect to Si which is typically used as the substrate for semiconductor devices. By doping metal silicates, the high-k layers of the present invention retain the advantageous stability characteristics of the metal silicates relative to Si.

Preferably, the high-k layers have a k value significantly higher than the k value of SiO$_2$ (3.9). The metal oxide doped metal silicate layers formed according to the methods of the present invention easily reach k values greater than 10. Interfacial density of state with substrates (e.g. Si wafer) should preferably be similar to the SiO$_2$/Si interface, i.e. about $10^{10}$/eVcm. The high-k layers formed by the techniques of the present invention meet this requirement due to the concentration of metal silicates in the high-k layer.

The embodiments of the present invention provide a dielectric layer having sufficient high conduction band offset with the substrate (e.g. >1 eV) such that tunneling of currents can be prevented. With many high-k materials, the mobility of the CMOS channels are degraded or the device drive current is diminished, especially as the k values increase. The term "mobility" as used herein denotes the ability of electrons or holes in the semiconductor to move from one end of the channel to the other end. High channel mobility using a given gate dielectric material is important in the semiconductor industry. High channel mobility and therefore faster switching speeds are achieved according to the present invention by using a reduced concentration of metal in the metal silicate formation and by increasing the high polarizability bonding through the use of the weakly interacting dopants, i.e., the metal oxides introduced into the metal silicate layer. Moreover, the dielectric materials of the present invention are easily incorporated into conventional deposition and etching steps.

The performance of an appreciable number of mostly metal oxides with either one or two cation components have been examined with respect to these parameters. However, the compromises among the several parameters of many of the metal silicate high-k material compositions limit their suitability in MOS devices. For example, selected metal silicates such as $Hf_xSi_{1-x}O_2$, $Zr_xSi_{1-x}O_2$, $Y_xSi_{1-x})_2$ and $Gd_xSi_{1-x}O_{2-x/2}$ have also been studied. It is recognized by those of skill in the relevant art that $Hf_xSi_{1-x}O_2$ and $Zr_xSi_{1-x}O_2$ with low Hf/Zr concentration (e.g. 10-20%), and hence a lower k of about 10, give the highest stability, the lowest interfacial density of state and the smallest degradation of channel mobility in CMOS devices. High-k films generally tend to trap electrons as they flow through the channel, degrading carrier mobility. To increase the mobility and stability, a metal silicate formation with a lower k value (e.g., 10) is selected. However, a k value of 10 introduces only minimal improvement to the other devices such as memories and large capacitors as well as limiting the applications of such materials in CMOS devices with gate lengths <45 nm. Thus, the compromising of these requirements has given rise to an urgent need for alternative materials, such as those described in the present invention, which meet all of the above-described requirements.

FIG. 1 is a graphical plot illustrating the changes in dielectric constant of metal silicates associated with changes in the metal concentration. It has been shown that in the case of Zr silicate ($Zr_xSi_{1-x}O_2$), k increases continuously with x from 3.9 when x=0 to about 22 when x=1. A plot of this relationship, as extracted from D. A. Neumayer et al. ("Materials characterization of $ZrO_2$-$SiO_2$ and $HfO_2$-$SiO_2$ binary oxides deposited by chemical solution deposition", D. A. Neumayer and E. Cartier, Appl. Phys. Letts., 90 (2001) 1801), is illustrated in FIG. 1.

Corresponding to this variation is a change in the number of high polarizability bondings between Zr and O from 4 to 6 as shown in FIGS. 2A-2B. FIGS. 2A-2B are diagrams illustrating changes in bonding for metal silicates associated with changes in the metal concentration. As illustrated in FIG. 2A, several high polarizability bonds 202, 204, 206, and 208 form between Zr (201) and the O ions 210-213 that interact with single Si atoms 220-223. The high overall k values of silicates with higher Zr compositions (as illustrated in FIG. 1) can be derived from a summation of the effects of the high polarizability bonds. The concentration of Zr atoms results in a low percentage of high polarizability bonds for the low percentage composition of Zr in the silicate, e.g., for x=0.5 in $Zr_xSi_{1-x}O_2$.

The relative permittivity k, i.e., the dielectric constant, provides a measure of the polarizability of a material. With increased polarization, the separation of positive and negative charges in a material increase. High-k dielectric materials rely on this large polarizability with applied electric field for their unique electrical characteristics. Thus, a higher concentration of high polarizabilty bonds increases the dielectric constant for the dielectric.

As shown in FIG. 2B, an increase in the percentage of Zr in the metal silicate results in an increase in the number of high polarizability Zr—O bonds in $Zr_xSi_{1-x}O_2$ for x=0.5. Conversely, as illustrated in FIG. 2A, increasing the concentration of Si (and thereby reducing the concentration of Zr), results in the formation of more low polarizability Si—O bonds at the expense of high polarizability Zr—O bonds. Thus, the overall k of the silicate is diminished. FIG. 2B illustrates six high polarizability bonds 230-235 formed between the Zr metal and the O ions 240-245. As a result, a higher k value is achieved in the dielectric.

But, as discussed above, adjusting the k value of a metal silicate in this manner compromises other parameters. For example, a lower Zr concentration is necessary to maintain a low interfacial density of state and a high channel mobility so that CMOS devices can perform properly. That is, using silicates with lower cation concentration for CMOS devices so as to sustain a suitably high mobility will inevitably result in a k value lower than desired.

The present invention focuses on the introduction of dopants into low cation content silicates that will increase the formation of high polarizability bonds between metal species and oxygen, and therefore enhance the overall k of the material, without compromising the other properties such as interfacial density of states and channel mobility in CMOS. This is achieved by encouraging the direct interaction of metal species in the silicates with oxygen bonded with Si, or alternatively with oxygen ions dissociated from dopants.

The introduction of dopants with dissociable oxygen in order to modify the atomic random networks (and hence termed a modifier) is known in the art of silicate based glasses, such as soda-lime and borosilicates. After dissociating, oxygen from the oxide dopants interact with the Si atoms in the silicate networks, and result in the modification of thermal as well as optical properties. The cations from the dopants eventually reside in the vicinity of the oxygen's, providing local charge neutrality.

The present invention preferably combines oxides having known low to medium dissociation energies (e.g., 602 kJ/mol for $Li_2O$, 1075 kJ/mol for both CaO and SrO) for modifying the structures around the cation species in the metal silicates, and thereby increasing the number of high polarizability bonds per silicate metal ion while maintaining overall charge neutrality.

FIG. 3 is a diagram illustrating the increase in high polarizability metal-oxygen bonding from oxide-based dopants in accordance with one embodiment of the present invention. Metal silicates, for example, formed using a group IV metal, can achieve an overall atomic and charge balance of the process as follows:

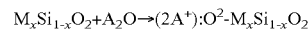

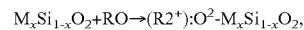

where M is a group IV metal (e.g. Hf, Zr, Ti), A is an alkaline metal (e.g. Na, Li) and R is alkaline earth metal (e.g. Be, Ca, Sr). These metals are intended to be illustrative and not limiting. For example, other suitable metals for forming the metal silicate layer are expected to include at least Sc, Y, La, Ti, Zr, Hf, Nd, Sm, Gd, Fe, Co, Cr, V, Yb and Al. As a further example, Mg, W, Bi, Ba, Ta, Pb, U, Th, and Cu are expected to be suitable. Further illustrative, the Group IIIB metals in the periodic table (e.g., Sc, Y, La, and Ac) are expected to perform suitably in forming the metal silicate layer as are the Group IVB metals. The above identified metals used in forming the metal silicates are intended to be illustrative and not limiting. All metals that form high polarizability bonds with oxygen are expected to be suitable and the scope of the present invention is intended to include such materials.

Likewise, the metals identified above as suitable for forming the metal oxides are illustrative and not limiting. That is, Na, Li, Be, Ca, and Sr are examples of metals which form suitable metal oxides for doping in accordance with the techniques of the present invention. The scope of suitable metal oxide materials is intended to include any metal oxide having bond strength less than about 444 kJ/mol, which is the bond strength of $SiO_2$. In a preferred embodiment, the metal oxide has a bond strength in the range between 50 and 350 kJ/mol, more preferably between 150 and 350 kJ/mol. As known to those of skill in the relevant arts, the bond strength values are interrelated with the dissociation energies for the dopant oxides. Hence, suitable dopants include oxides with dissociation energies less than about 1774 kJ/mol. In a preferred embodiment, the oxides have dissociation energies in the range between 400 and 1700 kJ/mol, more preferably between 400 and 1400 kJ/mol.

As illustrated in FIG. 3, the metal (M) 302 is shown forming six high polarizability bonds 310-315 with O ions 320-325. Oxygen ions 321 as 324 are formed by the dissociation of the low bond strength of the dopant oxide. Thus, a high concentration of high polarizability bonds (e.g., 310-315) can be formed, thereby increasing the k value without increasing the concentration of the M metal.

This dopant-dissociation and new M-O bond formation process is mainly driven by the difference in the bond strengths between the dopants and M-O bondings. Bond strengths as measured in kJ/mol of the dopants and M-O are listed in Table 1 below for reference. Suitable dopants may be selected based on their bond strengths.

Although the invention has been described above with respect to silicates formed with Zr, the invention is not so limited. The scope of the invention is intended to extend to the formation of all high-k materials using weakly interacting dopants, i.e., oxide dopants that encourage the formation of high polarizability bonds without substantially changing the overall atomic packing features. As an example, in one embodiment the metal silicate is one formed using a metal M from the group IV metals, for example, Ti, Zr, and Hf, with the metal oxide dopants formed from the alkaline metal (e.g. Na, Li) and alkaline earth metal (e.g. Be, Ca, Sr) groups. However, the techniques of the present invention are intended to include the formation process in silicates with metals from other groups (e.g. Y, Al, La, Sm, Nd, Yb, Gd), such as can be formulated using similar equations as described above. That is, the metals listed heretofore.

The exact concentration of the dopants, on the other hand, depends on the phase stability of the material systems of interest. The dopants can be introduced during film deposition or post-deposition treatments such as diffusion according to process methods well known to those of skill in the relevant art, as generally described below.

The increase in k-values results from the increase in high polarizability M-O bonding by weakly interacting, oxide based dopants through the dissociation of the dopants. An alkaline metal oxide, $A_2O$, dopant such as $Li_2O$ is used as an example. Table 1 lists the bond strengths of the group IV silicates as well as the suggested dopants detailed in the example above. The table illustrates that the dopant, preferably a metal oxide, is selected to have a lower bond strength than that of the silicate, to allow dissociation of O ions to occur and to thereby increase the formation of high polarizability bonds with the metal ion. Thus, the scope of the invention is intended to extend to any oxide dopants having a lower bond strength than that of the metal ion with oxygen in the metal silicate.

FIGS. 4A-C are diagrams illustrating the stages in forming a modified high-k dielectric layer in accordance with one embodiment of the present invention. In this embodiment, the doped metal silicate high-k layer is formed in a post deposition treatment step. The process begins with a metal silicate layer 404 formed on a substrate 402. The substrate can be a silicon wafer according to one embodiment. The deposition of the metal silicate layer may be performed in accordance with techniques well known to those of skill in the relevant arts. For example, in a preferred embodiment, the metal silicate layer is deposited on the surface of the semiconductor substrate by employing a physical vapor deposition (PVD) process, a chemical vapor deposition (CVD) process or a plasma enhanced chemical vapor deposition (PECVD) process. Other examples of suitable deposition processes include, without intending to be limiting, an atomic layer deposition process (ALD). According to a preferred embodiment, the concentration of the metal in the metal silicate is selected to retain the desired characteristics of channel mobility and interfacial density of states. For example, the value of x for the concentration of the metal M in $M_xSi_{1-x}O_2$ is preferably in the range from 0.05 to 0.5, more preferably from 0.1 to 0.3.

Next, as illustrated in FIG. 4B, a relatively thin dopant layer 406 is deposited on the metal silicate layer. The thickness of the dopant layer 406 is dependant upon the desired concentration of dopants to be incorporated into the metal silicate layer 404 from the surface and upon the metal oxides used. For example, when CaO is used as the metal dopant, two Ca ions will be needed for each metal (e.g., Zr) molecule in order to raise the number of high polarizability bonds with each Zr ion. Alternatively, when $Li_2O$ is used as the dopant, four Li ions are needed for each Zr ion for the same effect. Preferably, the dopants are oxides with dissociation energies less than about 1774 kJ/mol.

The impurity concentration at the surface layer of the dopant 406 is reduced in a subsequent drive-in step after the initial predeposition step as illustrated in FIG. 4C. Thus, the impurity ions (e.g. metal oxide dopants) are driven from the surface into the bulk of the metal silicate layer. Preferably, the dopants driven into the metal silicate layer 504 have a low bond strength, thereby allowing the oxygen ions to dissociate and to combine with the metal in the metal silicate layer to form high polarizability bonds. Preferably, the impurity (metal oxide) is distributed uniformly throughout the metal silicate layer to enhance the high-k value of the metal silicate.

According to an alternative embodiment, as illustrated in FIGS. 5A-B, the doped metal silicate high-k dielectric may be formed in situ with the deposition of the metal silicate. As illustrated, in a preferred embodiment, the doped metal silicate layer 506 is deposited on the surface of the semiconductor substrate 502 by employing a chemical vapor deposition (CVD) process, a plasma enhanced chemical vapor deposition (PECVD) process, or an atomic layer deposition process (ALD) and flowing precursor gases 503 for the formation of the dopant oxide with the precursor gases 505 for the formation for the doped metal silicate 506 as shown in FIG. 5B. Alternatively, the doped film can be deposited by transferring materials of a pre-determined composition from a target using a physical vapor deposition process (PVD), such as laser ablation and sputtering.

The present invention advantageously utilizes metal silicates, widely accepted by the CMOS industry as a high-k dielectric, and utilizes their known channel mobility and interface density of state characteristics. Moreover, an abundance of data is available regarding the thermodynamic and

TABLE 1

| Silicate | Bond | Bond strength (kJ/mol) | Dopant | Bond | Bond strength (kJ/mol) |
|---|---|---|---|---|---|
| Hf silicate | Hf—O | 339 | $Li_2O$ | Li—O | 106 |
| Zr-silicte | Zr—O | 339 | $Na_2O$ | Na—O | 64 |
| Ti silicate | Ti—O | 305 | BeO | Be—O | 264 |
| | | | CaO | Ca—O | 134 |
| | | | SrO | Sr—O | 134 | kinetic properties of metal silicates. Using the techniques of the present invention, as with conventional metal silicate dielectric layers, no interfacial layer is needed. Thus, the materials can be used for multi-generations of technologies if their k can be increased accordingly. Since the metal silicates as used in the present invention are typically in an amorphous state, lower leakage currents result.

Although the dopants are described and illustrated using dopant oxides, the invention is not so limited. The scope of the invention is intended to extend to any and all methods of modifying the polarizability bonds of the metal silicates by introducing a dopant having weaker bond strength with oxygen than the corresponding bond strength of the oxygen in the metal silicate.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A high-k dielectric layer for a semiconductor integrated circuit, the layer comprising:
a metal silicate layer that includes metal silicates comprising at least one of Sc, Y, La, Ti, Nd, Sm, Gd, Fe, Co, Cr, V, Mg, W, Bi, Pb, U, Th, Cu and Yb doped with dopant oxides having dissociable oxygen to form a high-K dielectric layer suitable for use in a channel of a CMOS device in the electrical circuitry of a semiconductor integrated circuit, the high-K dielectric layer having a K value of greater than 10.

2. The high-k dielectric layer as recited in claim 1, wherein the dopant oxide is an oxide of one of an alkaline metal and an alkaline earth metal.

3. The high-k dielectric layer as recited in claim 1, wherein the dopants are oxides with dissociation energies less than about 1774 kJ/mol.

4. The high-k dielectric layer as recited in claim 3, wherein the dopant oxides having dissociable oxygen include at least one of oxides of Na and Be.

5. The high-k dielectric layer as recited in claim 1, wherein the metal silicate layer includes metal silicates of at least one of Sc, Y, La, and Ac.

6. The high-k dielectric layer as recited in claim 1, wherein the dopant oxides having dissociable oxygen include at least one of oxides of Na and Be.

7. The high-k dielectric layer as recited in claim 1, wherein the metal silicate layer includes metal silicates of at least one of Mg, W, Bi, Ba, Ta, Pb, U, Th, and Cu.

8. The high-k dielectric layer as recited in claim 1, wherein the high-k dielectric layer has an interfacial density of approximately the same as the interfacial density at a silicon and silicon dioxide interface.

9. The high-k dielectric layer as recited in claim 1, wherein the high-k dielectric layer has an interfacial density of approximately $10^{10}$ eV/cm.

* * * * *